(12) United States Patent
Ryter

(10) Patent No.: US 8,457,567 B2
(45) Date of Patent: Jun. 4, 2013

(54) AMPLITUDE MODULATION CONTROLLER FOR POLAR TRANSMITTER

(75) Inventor: Roland Ryter, Bubikon (CH)

(73) Assignee: ST-Ericsson SA, Plan-les-Ouates (CH)

( * ) Notice: Subject to any disclaimer, the term of this patent is extended or adjusted under 35 U.S.C. 154(b) by 368 days.

(21) Appl. No.: 12/785,212

(22) Filed: May 21, 2010

(65) Prior Publication Data

US 2010/0297965 A1 Nov. 25, 2010

Related U.S. Application Data

(63) Continuation-in-part of application No. PCT/EP2008/009976, filed on Nov. 21, 2008.

(30) Foreign Application Priority Data

Nov. 23, 2007 (EP) .................................... 07121442

(51) Int. Cl.
*H03C 5/00* (2006.01)
(52) U.S. Cl.
USPC ..................... 455/108; 455/127.1; 455/127.2; 455/127.3; 455/127.4; 332/145; 332/149; 332/151; 375/297; 375/308

(58) Field of Classification Search
USPC ............. 455/127.2, 232.1, 108, 127.1, 127.3, 455/127.4; 332/145, 149, 151; 375/297, 308
See application file for complete search history.

(56) References Cited

U.S. PATENT DOCUMENTS

| | | | |
|---|---|---|---|
| 4,598,252 A | 7/1986 | Andricos | |
| 6,141,169 A | 10/2000 | Pietruszynski et al. | |
| 6,653,909 B2 * | 11/2003 | Nielsen | 332/151 |
| 6,868,279 B2 | 3/2005 | Sahlman et al. | |
| 2004/0132470 A1 | 7/2004 | Checoury et al. | |
| 2005/0271161 A1 | 12/2005 | Staszewski et al. | |
| 2006/0068726 A1 | 3/2006 | Yamawaki | |
| 2006/0160499 A1 * | 7/2006 | Puma | 455/116 |
| 2009/0011730 A1 * | 1/2009 | Liang et al. | 455/127.2 |
| 2009/0042525 A1 * | 2/2009 | Rajagopal et al. | 455/232.1 |

* cited by examiner

*Primary Examiner* — Junpeng Chen
(74) *Attorney, Agent, or Firm* — Potomac Patent Group PLLC

(57) ABSTRACT

Apparatus for generating a modulation signal for use in modulating the power supply of a power amplifier uses coarse and fine control for controlling the amplitude of the modulation signal, and thereby controlling the output power of the power amplifier. The modulation signal may be generated in the digital domain and converted to the analog domain by a digital-to-analog converter, with the digital-to-analog converter providing the fine control and a variable gain amplifier providing the coarse control of the analog signal.

25 Claims, 4 Drawing Sheets

| Digital AM (Decimal Code) | $I_P/I_{ref}$ | $I_N/I_{ref}$ | $(V_P-V_N)/R_0 I_{ref}$ |
|---|---|---|---|
| 0 | n | n | 0 |
| 1 | n−1 | n+1 | 2 |
| 2 | n−2 | n+2 | 4 |
| ⋮ | ⋮ | ⋮ | ⋮ |
| (n−1)/2 | (n+1)/2 | (3n−1)/2 | n−1 |
| (n+1)/2 | (n−1)/2 | (3n+1)/2 | n+1 |
| ⋮ | ⋮ | ⋮ | ⋮ |
| n−2 | 2 | 2n−2 | 2n−4 |
| n−1 | 1 | 2n−1 | 2n−2 |
| n | 0 | 2n | 2n |

FIG. 4

AMPLITUDE MODULATION CONTROLLER FOR POLAR TRANSMITTER

BACKGROUND

1. Technical Field

The disclosure relates to apparatus for controlling a modulation signal for use in modulating the power supply of a power amplifier, a module comprising the apparatus, a transmitter comprising the module, and communications equipment comprising the transmitter.

2. Description of the Related Art

Polar modulation architecture has become quite popular in recent years, at least in scientific publications, as an alternative to the direct Cartesian (I&Q) up-conversion architecture, for transmitters targeting hand-set applications where communication standards with amplitude modulation, such as EDGE, are used. This is because a polar modulation transmitter can have a lower power consumption and lower cost. The cost is lower, at least in part, because there is no need for a surface acoustic wave (SAW) filter at the output of the transmitter.

A typical polar modulation transmitter 100 of the prior art is illustrated in FIG. 1. Separate amplitude and frequency components of the modulation signal are generated in the digital domain and provided to, respectively, inputs 110 and 120. A sigma-delta converter 140 converts the digital frequency component to a digital control signal for controlling the divider ratio of a fractional-N phase locked loop 150 for modulating the phase of a voltage controlled oscillator 155. The output of the voltage controlled oscillator 155 is coupled to a saturated power amplifier (PA) 160, and the amplified signal is provided at an output 130 to an antenna. The digital amplitude component is provided to an amplitude modulation controller 170 which converts the digital amplitude component to the analog domain and scales it based on a scaling signal at an input 175 to provide an analog amplitude modulation signal to a power supply modulator 180 for modulating the supply voltage of the PA 160. This supply voltage determines the power of the amplified signal output by the PA 160 and hence to the antenna. Typically, the power supply modulator 180 and the PA 160 are provided in a front-end module (FEM) 190.

Typically, the PA 160 needs a certain DC voltage to start providing any signal at the output 130 to the antenna. This is illustrated in FIG. 2 by a typical graph of PA output amplitude as a function of PA supply voltage, where it can be seen that almost no output power is generated until the supply voltage reaches about 0.2V. So, the amplitude modulation controller 170 usually receives a DC offset control signal at an input 185 for controlling DC offset in the analog amplitude modulation signal.

The desired power of the signal at the antenna depends on the length and quality of the signal path between the transmitter 100 (in a handset) and a base station. These parameters can vary greatly, meaning that the PA 160 preferably provides the amplified signal over a large range of power levels, typically about three power decades.

If the scaling is performed in the digital domain, the amplitude modulation controller 170 usually requires a digital-to-analog converter (DAC) having a high dynamic range in order to provide an analog amplitude modulation signal having a good signal-to-quantization-noise ratio and suitable for allowing the power supply modulator 180 to modulate the supply voltage to the PA 160 sufficiently for the PA 160 to output the amplified signal over the desired large range of power levels. However, a typical high dynamic range DAC having over 14-bits and using a sampling frequency of at least 3.25 MHz requires a large operating current and a large chip area in an integrated circuit. Likewise, if the scaling is performed in the analog domain, prior art devices employ complex analog circuit elements to obtain fine control of the gain applied to the analog signal over a wide range of gain values.

BRIEF SUMMARY

According to a first aspect of the disclosure there is provided an apparatus for controlling a modulation signal for use in modulating a power supply of a power amplifier, comprising:

a power controller for generating an indication of a desired mean output power of the power amplifier, the indication comprising a coarse control signal providing a relatively coarse indication and a fine control signal providing a relatively fine indication;

a coarse amplitude controller for providing relatively coarse control of the amplitude of the modulation signal in response to the coarse control signal; and a fine amplitude controller for providing relatively fine control of the amplitude of the modulation signal in response to the fine control signal.

Thus the disclosure provides an improved architecture for an amplitude modulation controller by providing separate coarse and fine control of the amplitude of the modulation signal. By providing separate coarse and fine control, fine control of the amplitude of the modulation signal over a wide range of amplitudes can be achieved with a lower dynamic range DAC and/or less complex analog circuitry elements than in the prior art. This, in turn, allows lower power consumption and small chip area to be achieved. Furthermore, the requirement for wide dynamic range filtering associated with use of a high dynamic range DAC can be avoided, further reducing power consumption and chip area.

Optionally, the modulation signal is generated as a digital modulation signal, and the apparatus comprises a DAC for converting the digital modulation signal to an analog modulation signal, wherein the DAC is adapted to provide the relatively fine control of the amplitude of the analog modulation signal in response to the fine control signal. Thus the fine control can be integrated into the DAC, enabling high resolution control with low complexity, low power consumption, and small chip area.

Optionally, the DAC may comprise an array of selectable current elements each adapted to provide a reference current to either output of a differential pair of outputs, a selector for selecting, dependent on the digital modulation signal, which of the current elements provide their respective reference current to the outputs, and a current controller for controlling the reference current dependent on the fine control signal. Thus the fine control can be implemented simply by varying the reference current, and can be integrated into the DAC in a simple manner, enabling high resolution control with low complexity, low power consumption, and small chip area.

Optionally, the apparatus may comprise a semiconductor device for providing a bandgap voltage, wherein the current controller comprises a programmable resistance responsive to the fine control signal for generating the reference current from the bandgap voltage. The use of a bandgap voltage contributes to a highly accurate reference current.

Optionally, the DAC is adapted to scale the amplitude of the analog modulation signal in response to the fine control signal whilst the amplitude range of the digital modulation signal remains substantially constant. Thus the amplitude range of the modulation may be controlled solely in the analog domain, which can avoid the need for low amplitude digital signals which would have a relatively poor signal-to-quantization-noise ratio. A constant amplitude digital modulation signal has a constant signal-to-quantization-noise ratio.

Optionally, the DAC is arranged such that the digital modulation signal occupies at least 90%, and preferably 100%, of the digital range of the DAC, irrespective of the required mean output power indicated by the power controller. By using the majority, or the whole, of the DAC digital range, even when a low output power level is desired, a high signal-to-quantization-noise ratio can be maintained. Conversely, for a particular signal-to-quantization-noise ratio, the word size of the DAC may be reduced, enabling low complexity, low power consumption, and small chip area. For example, the signal-to-quantization-noise ratio is the same for a 13-bit DAC operated over 11.25% of its range, a 12-bit DAC operated over 22.5% of its range, an 11-bit DAC operated over 45% of its range, and a 10-bit DAC operated over 90% of its range.

Optionally, the coarse amplitude controller comprises a variable gain amplifier having a gain responsive to the coarse control signal. Such a controller can have a low complexity, low power consumption, and small chip area, avoiding for example the need for a more complex analog multiplier circuit.

Optionally, the variable gain amplifier is adapted to control the DC offset of the analog modulation signal in response to a DC control signal. Thus DC offset control can be combined with amplitude control.

Optionally, the DAC is adapted to provide the analog modulation signal as a differential signal, and the coarse amplitude controller is adapted to provide differential to single ended conversion of the analog modulation signal. Thus the amplitude control may be performed on differential signals which are inherently resistant to substrate noise and interferers, and conversion to single ended signals as required for modulating the power supply of a power amplifier can be combined with the amplitude control.

The disclosure also provides a module comprising the apparatus according to the first aspect of the disclosure, an amplifier, and a power supply modulator for modulating a power supply to the amplifier with the analog modulation signal. The disclosure also provides a transmitter comprising the module, and a communication equipment comprising the transmitter.

BRIEF DESCRIPTION OF THE SEVERAL VIEWS OF THE DRAWINGS

The disclosure will now be described, by way of example only, with reference to the accompanying drawings where:

FIG. 4 is a table of DAC currents and voltages for different digital input values.

DETAILED DESCRIPTION

Figure 1:
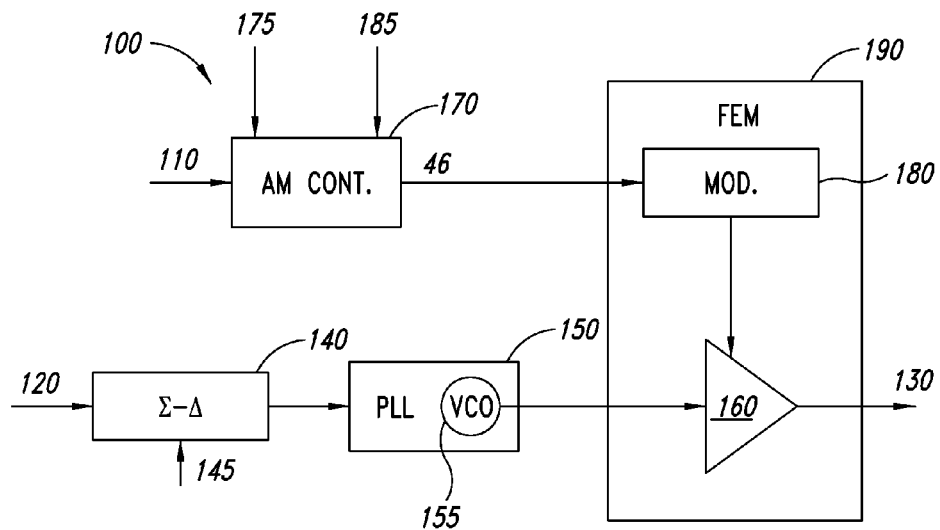
FIG. 1 is block schematic diagram of a polar modulation transmitter of the prior art.
Figure 2:
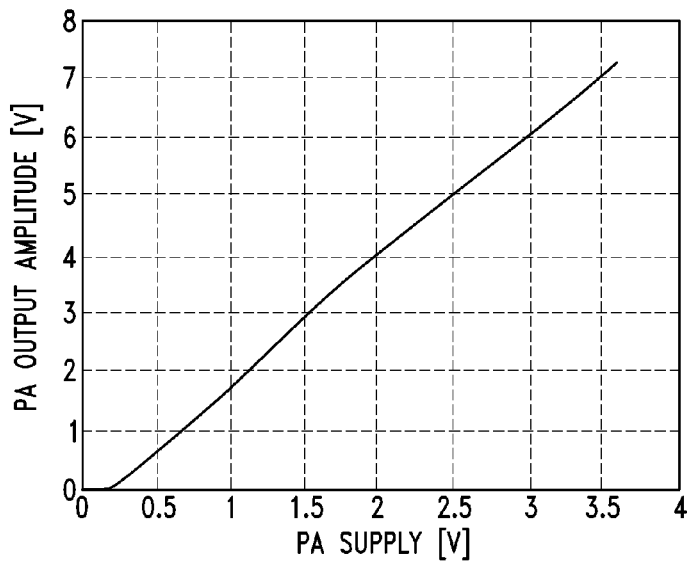
FIG. 2 is a graph of power amplifier output power as a function of power amplifier supply voltage for the polar modulation transmitter shown in FIG. 1.
Figure 3:
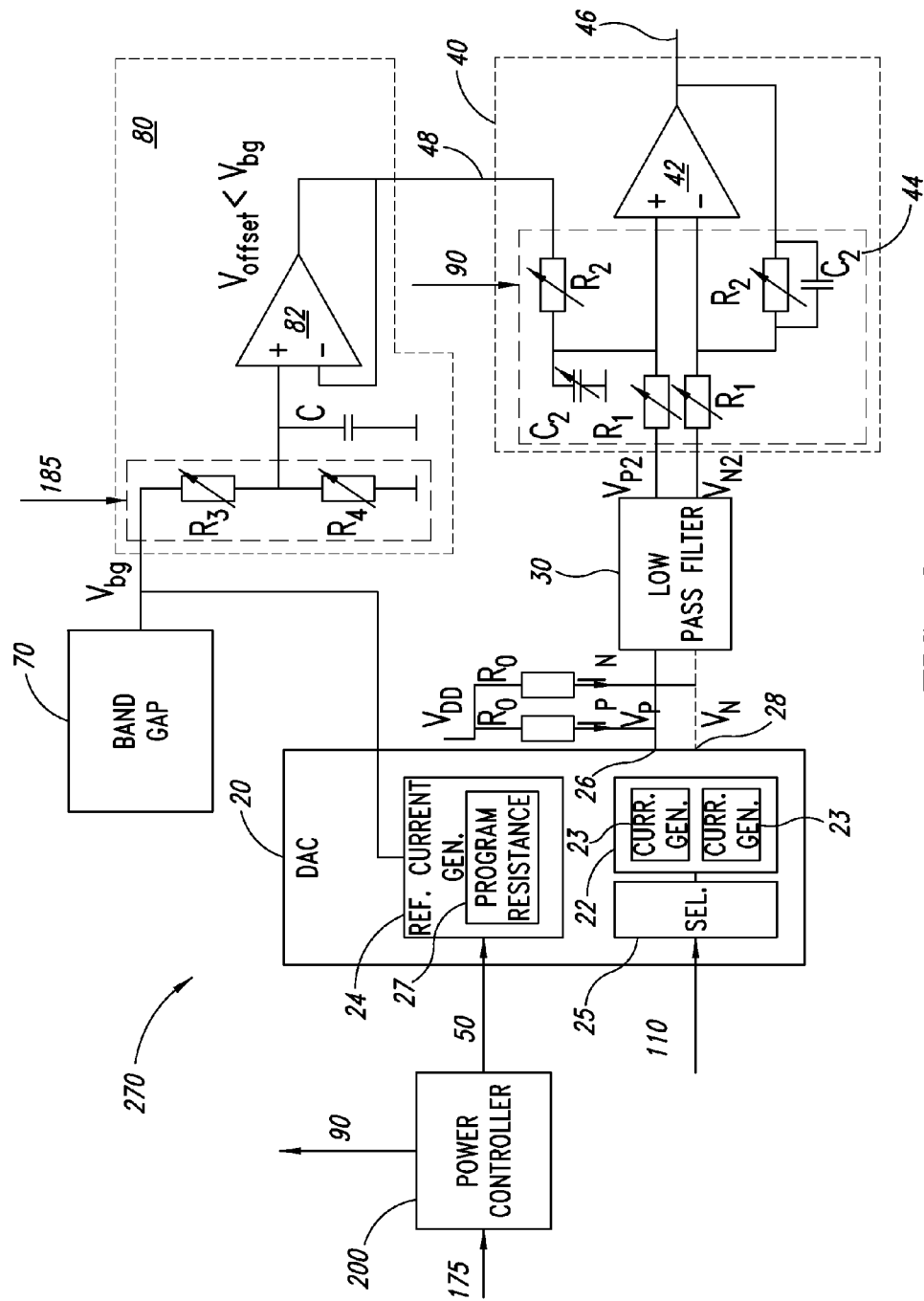
FIG. 3 is a block schematic diagram of an apparatus for controlling a modulation signal according to a preferred embodiment of the present disclosure.

In a preferred embodiment of the present disclosure, the amplitude modulation controller 170 of the polar modulation transmitter 100 of the prior art shown in FIG. 1 is replaced with the amplitude modulation controller 270 shown in FIG. 3. As in the prior art, the amplitude modulation controller 270 of the preferred embodiment of the present disclosure receives the digital amplitude modulation signal at an input 110. It also receives the scaling signal at the input 175 and DC offset control signal at the input 185 and, at an output 46, provides a scaled amplitude modulation signal with appropriate DC offset according to these signals. However, in contrast to the prior art, the amplitude modulation controller 270 of the preferred embodiment of the present disclosure has a power control stage 200 for controlling scaling of the amplitude modulation signal based on the scaling signal at the input 175 using a fine control and a coarse control, as described in more detail below.

Referring to FIG. 3, the digital amplitude modulation signal is provided at the input 110 of the amplitude modulation controller 270 which is coupled to a DAC 20. The DAC 20 is a current DAC and its output current $I_P$, $I_N$, and output voltage $V_P$, $V_N$, are dependent on a reference current $I_{ref}$ provided by a reference current generator 24, as well as being dependent on resistors $R_0$ coupled between output nodes 26, 28 and a voltage rail $V_{DD}$. An output of the DAC 20 is coupled to an input of a low pass reconstruction filter 30 for smoothing the signal provided at the output of the DAC 20, by removing replicas of the spectrum of the digital amplitude modulation signal which occur at multiples of the sampling frequency of the digital amplitude modulation signal. An output of the reconstruction filter 30 is coupled to an input of the variable gain amplifier 40 which amplifies the smoothed signal and provides the analog amplitude modulation signal at the output 46.

Looking firstly at the fine control of the scaling of the amplitude modulation signal, a band-gap circuit 70 generates a reference voltage $V_{bg}$ which is independent of temperature and integration process. The output impedance of the band-gap circuit 70 should be much lower than variable resistors R3 and R4, described later. An output of the band-gap circuit 70 is coupled to the reference current generator 24, which uses the reference voltage $V_{bg}$ to generate the reference current $I_{ref}$.

The reference current generator 24 is programmable, such that the magnitude of the reference current $I_{ref}$ is dependent on a digital value provided at an input 50 by the power controller 200 based on the scaling signal at the input 175. This digital value comprises a fine control signal. So, the reference current $I_{ref}$ is programmable in relatively small steps over a relatively small range. The reference current generator 24 may employ, for example, a programmable resistance 27 to derive the reference current $I_{ref}$ from the reference voltage $V_{bg}$. Since a multiple of the reference current $I_{ref}$ flows through the same type of resistor in the subsequent stages of the amplitude modulation controller 270, the output signal accuracy is given by the absolute accuracy of the band-gap voltage and matching of components.

The DAC 20 has a differential output and comprises an array of selectable current elements 23 each of which can provide a current $I_{ref}$ to a positive output node 26 of the DAC 20, their sum constituting the current $I_P$, or to a negative output node 28 of the DAC 20, their sum constituting the current $I_N$. The selection of current elements is made by a selector 25 dependent on the digital value of the digital amplitude modulation signal at the input 110. This enables monotonic and highly linear digital-to-analog conversion.

The table of FIG. 4 provides an example of the relationship between the digital value of the digital amplitude modulation signal (first column) and the current $I_P$ at the positive output node 26 (second column) and the current $I_N$ at the negative output node 28 (third column), where the current values in the table are expressed normalized to the value of $I_{ref}$, i.e., the values indicate a multiple of $I_{ref}$. The fourth column in FIG. 4 indicates a differential voltage $V_P-V_N$, where $V_P$ and $V_N$ are the voltages at respectively the positive output node 26 and the negative output node 28 resulting from passing the output currents $I_P$, $I_N$ through respective resistors $R_0$. For example, a digital value of 0 results in $I_P=I_{ref}\cdot n$ and $I_N=I_{ref}\cdot n$ such that the differential output voltage $V_P-V_N=0$. As another example, a digital value of (n−1)/2 results in $I_P=I_{ref}\cdot(n+1)/2$ and $I_N=I_{ref}\cdot(3n-1)/2$ such that the differential output voltage $V_P-V_N=R_0\cdot I_{ref}\cdot(n-1)$. For a 10-bit DAC, n=1023. After filtering the voltages $V_P$ and $V_N$, the reconstruction filter 30 provides the filtered voltages respectively $V_{P2}$ and $V_{N2}$ to differential inputs of the variable gain amplifier 40.

Looking now at the coarse control of the scaling of the amplitude modulation signal, the variable gain amplifier 40 comprises an operational amplifier 42 which provides differential to single-ended conversion, and a gain control stage 44. The gain control stage 44 comprises a variable resistor $R_1$ coupled in series with each of the differential inputs of the variable gain amplifier 40 and the respective differential inputs of the operational amplifier 42, a feedback circuit coupled between the output 46 and a negative input of the operational amplifier 42, and a DC-setting circuit coupled between a positive input of the operational amplifier 42 and a DC control input 48 of the variable gain amplifier 40. The feedback circuit comprises a capacitor $C_2$ coupled in parallel with a variable resistor $R_2$. The DC-setting circuit comprises a capacitor $C_2$ coupled between the positive input of the operational amplifier 42 and ground, and a variable resistor $R_2$ coupled in series between the positive input of the operational amplifier 42 and the DC control input 48. This combination $C_2$, $R_2$ provides a first order low pass filter which can assist in meeting low-noise specifications of the transmitted spectrum, especially for EDGE where spectral components over 20 MHz can fall into the receive frequency band and degrade reception by a nearby handset. Similarly, for a transceiver complying with the UMTS standard, it is important to minimize out-of-band spectral components in a transmitted signal as these can degrade simultaneous reception during duplex operation of a handset. The gain of the variable gain amplifier 40 is controlled by varying the value of the variable resistors $R_1$, $R_2$ in response to a digital value applied at a gain control input 90 by the power controller 200. This digital value comprises a coarse control signal. $C_2$ is varied in a corresponding manner to keep the product $R_2C_2$ constant.

The digital value provided by the power controller 200 at the input 50 for programming the magnitude of the reference current $I_{ref}$ used by the DAC 20, and the digital value applied by the power controller 200 at the gain control input 90 to control the gain of the variable gain amplifier 40, are such that the overall gain of the modulation signal is controlled by the scaling signal at the input 175. However, as fine control of the scaling is provided by varying the reference current $I_{ref}$ of the DAC 20 and coarse control of the scaling is provided by varying the gain of the variable gain amplifier 40, fine control is provided over a wide range with less complexity. For example, 10 fine control settings and 10 coarse control settings can achieve 100 different gain levels using just 20 control settings overall. If 100 different gain levels were to be provided in a single stage of gain control, as in the prior art, 100 gain control settings would be needed and the complexity of the gain control would be approximately five times higher.

In this embodiment, the power controller 200 is implemented in a processor, although suitable circuits or multiple processors can be used in other embodiments. Also, the digital amplitude modulation signal is received at the DAC 20 independently of the power controller 200. However, in other embodiments, a processor in which the power controller 200 is implemented may also generate the digital amplitude modulation signal. The DAC 20 may therefore receive the digital amplitude modulation signal from the processor.

The DC offset of the signal at the output 46 is controlled by varying a DC offset voltage $V_{offset}$ voltage applied at the DC control input 48. In more detail, a DC offset generator 80 is coupled to the band-gap circuit 70. The DC offset generator 80 has a voltage divider, comprising series coupled variable resistors $R_3$ and $R_4$, to which the band-gap voltage $V_{bg}$ is applied. The divided voltage is applied to an input of an amplifier 82, the output of which is coupled to the DC control input 48 of the variable gain amplifier 40 and provides the DC offset voltage $V_{offset}$. A capacitor C is also coupled between the input of the amplifier 82 and ground in order to reduce noise, for example thermal noise from resistors, and interference.

The DC offset voltage $V_{offset}$ is less than the band gap voltage $V_{bg}$. It is controlled by varying the values of at least one of the variable resistors $R_3$ and $R_4$ of the voltage divider in response to the DC offset control signal at the input 185. In this way, the DC offset at the output 46 of the variable gain amplifier 40 can be adjusted to compensate for any unwanted offset in the modulation signal and to provide a wanted offset voltage to the output 46 to ensure an RF output signal, as described above.

A feature of the amplitude modulation controller 270 of the preferred embodiment of the present disclosure is that the analog amplitude modulation voltage provided at the output 46 is single ended and always positive. This is in contrast to a Cartesian architecture in which I and Q signals have both polarities. Furthermore, the amplitude of the analog amplitude modulation signal can be varied over a wide range. This is in contrast to the scaling in a transmitter using a Cartesian architecture, where the scaling is normally done in a mixer or in a variable gain pre-amplifier preceding a linear power amplifier.

Furthermore, by scaling the amplitude modulation signal in the analog domain, the DAC 20 is not required to have a relatively high dynamic range and the reconstruction filter 30 is not required to have a wide dynamic range, in contrast to the prior art. Indeed, as the digital modulation signal is not scaled according to the preferred embodiment of the disclosure, its amplitude range remains substantially constant. The digital range of the DAC 20 can therefore be conveniently matched to the amplitude range of the digital amplitude modulation signal. In other words, even if the scaled analog amplitude modulation signal is not required to be more than say 10% of the maximum amplitude, the amplitude range of the digital amplitude modulation signal can still occupy, say, 70% or 80% or 90% or 100% of the digital range of the DAC 20.

Furthermore, the separate coarse and fine control also keeps the complexity low. If scaling were to be provided in the analog domain solely by the DAC 20, the DAC 20 would require a higher complexity, higher power and larger chip area. More significantly, the reconstruction filter 30 would need a wide dynamic range, resulting in increased power consumption, and chip area would be larger due to the requirement for many gain stages and due to the requirement for increased transistor sizes to reduce noise. Similarly, if gain control were to be provided in the analog domain solely by the variable gain amplifier 40, such an amplifier would require a higher complexity, higher power and larger chip area, such as a large array of selectable resistors for gain setting.

Although embodiments have been described in which the current provided by each of the selectable current elements 23 of the DAC 20 is the same as the reference current $I_{ref}$ provided by the current generator 24, in practice the current provided by the current elements 23 of the DAC may be a scaled version of the reference current provided by the current generator 24, for example $2I_{ref}$ or $I_{ref}/2$.

Although embodiments have been described which use a current DAC 20, the use of other types of DAC, for example a resistor ladder DAC, is not precluded.

Figure 5:
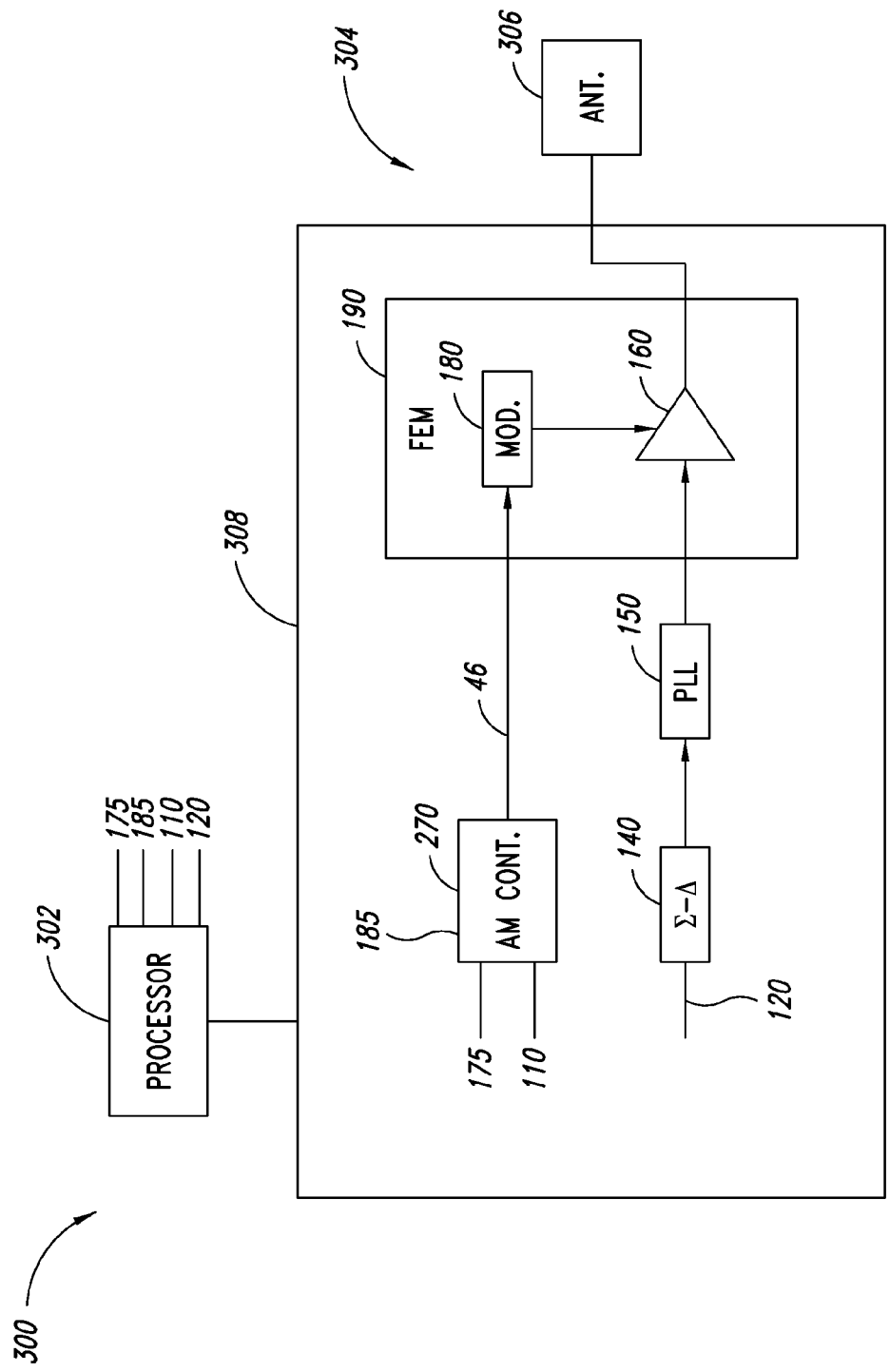
FIG. 5 is a block diagram of a communication device according to one embodiment of the present disclosure.

FIG. 5 is a block diagram of a communication device 300, such as a mobile phone, headset, etc. The communication device 300 includes a processor 302, controlling the operations of the device 300, and a transmitter 304 configured to transmitted communication signal under control of the processor 302. The transmitter 304 includes an antenna 306 and a transmitter circuit 308 that includes the amplitude modulation controller 270 of FIG. 3 and the FEM 190, Sigma-Delta converter 140, and PLL 150 from FIG. 1.

This disclosure can be employed in transmitters and transceivers for all communication systems using amplitude modulation of a transmitted signal, such as EDGE, UMTS and the Bluetooth 2.0+EDR standard. Although the disclosure may be used in applications using both amplitude and frequency or phase modulation, it may also be used in applications where amplitude modulation is used without frequency or phase modulation.

From reading the present disclosure, other variations and modifications will be apparent to the skilled person. Such variations and modifications may involve equivalent and other features which are already known in the art of transmitter design, and which may be used instead of, or in addition to, features already described herein.

Although the appended claims are directed to particular combinations of features, it should be understood that the scope of the present disclosure also includes any novel feature or any novel combination of features disclosed herein either explicitly or implicitly or any generalization thereof, whether or not it relates to the same disclosure as presently claimed in any claim and whether or not it mitigates any or all of the same technical problems as does the present disclosure.

Features which are described in the context of separate embodiments may also be provided in combination in a single embodiment. Conversely, various features which are, for brevity, described in the context of a single embodiment, may also be provided separately or in any suitable sub-combination.

The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, a single processor or other unit may fulfill the functions of several means recited in the claims and reference signs in the claims shall not be construed as limiting the scope of the claims.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An apparatus for controlling a modulation signal for use in modulating a power supply of a power amplifier, comprising:
   a power controller configured to generate an indication of a desired mean output power of the power amplifier, the indication comprising a coarse control signal providing a relatively coarse indication and a fine control signal providing a relatively fine indication;
   a coarse amplitude controller configured to provide relatively coarse control of an amplitude of the modulation signal in response to the coarse control signal; and
   a fine amplitude controller configured to provide relatively fine control of the amplitude of the modulation signal in response to the fine control signal,
   wherein the modulation signal is provided as a digital modulation signal, and the apparatus comprises a digital-to-analog converter for converting the digital modulation signal to an analog modulation signal;
   wherein the digital-to-analog converter is adapted to provide the relatively fine control of the amplitude of the analog modulation signal in response to the fine control signal; and
   wherein the coarse amplitude controller comprises a variable gain amplifier coupled to an output of the digital-to-analog converter and having a gain responsive to the coarse control signal.

2. The apparatus as claimed in claim 1, wherein the variable gain amplifier is configured to control the DC offset of the modulation signal in response to a DC control signal.

3. The apparatus as claimed in claim 1, wherein the fine control signal is a digital fine control signal and the digital-to-analog converter is configured to convert the digital fine control signal to an analog fine control signal and provide the relatively fine control of the amplitude of the analog modulation signal in response to the digital fine control signal.

4. The apparatus as claimed in claim 3, wherein the digital-to-analog converter comprises:
   a differential pair of outputs;
   an array of selectable current elements configured to provide respective reference currents to either output of the differential pair of outputs;
   a selector configured to select, dependent on the digital fine control signal, which of the current elements provide their respective reference current to the outputs; and
   a current controller configured to control the selected reference current dependent on the digital fine control signal.

5. The apparatus as claimed in claim 4, comprising a semiconductor bandgap voltage circuit configured to provide a bandgap voltage, and wherein the current controller comprises a programmable resistance responsive to the digital fine control signal and configured to generate the reference current from the bandgap voltage.

6. The apparatus as claimed in claim 3, wherein the digital-to-analog converter is configured to scale the analog fine control signal in response to the digital fine control signal while an amplitude range of the digital fine control signal remains constant.

7. The apparatus as claimed in claim 3, wherein the digital-to-analog converter is arranged such that the digital fine control signal occupies at least 90% of a digital range of the digital-to-analog converter, irrespective of the mean output power indicated by the power controller.

8. The apparatus as claimed in claim 3, wherein the digital-to-analog converter is configured to provide the analog fine control signal as a differential signal, and the coarse amplitude controller is configured to provide differential to single ended conversion of the analog fine control signal.

9. A module comprising:
an amplifier;
a power supply modulator for modulating a power supply to the amplifier with an analog modulation signal; and
an apparatus configured to provide the analog modulation signal, the apparatus including:
  a power controller configured to generate an indication of a desired mean output power of the power amplifier, the indication comprising a coarse control signal providing a relatively coarse indication and a fine control signal providing a relatively fine indication;
  a coarse amplitude controller configured to provide relatively coarse control of an amplitude of the modulation signal in response to the coarse control signal; and
  a fine amplitude controller configured to provide relatively fine control of the amplitude of the modulation signal in response to the fine control signal,
wherein the modulation signal is provided as a digital modulation signal, and the apparatus comprises a digital-to-analog converter for converting the digital modulation signal to an analog modulation signal;
wherein the digital-to-analog converter is adapted to provide the relatively fine control of the amplitude of the analog modulation signal in response to the fine control signal; and
wherein the coarse amplitude controller comprises a variable gain amplifier coupled to an output of the digital-to-analog converter and having a gain responsive to the coarse control signal.

10. The module as claimed in claim 9, wherein the fine control signal is a digital fine control signal and the digital-to-analog converter is configured to convert the digital fine control signal to an analog fine control signal and provide the relatively fine control of the amplitude of the analog modulation signal in response to the digital fine control signal.

11. The module as claimed in claim 10, wherein the digital-to-analog converter comprises:
a differential pair of outputs;
an array of selectable current elements configured to provide respective reference currents to either output of the differential pair of outputs;
a selector configured to select, dependent on the digital fine control signal, which of the current elements provide their respective reference current to the outputs; and
a current controller configured to control the selected reference current dependent on the digital fine control signal.

12. The module as claimed in claim 10, wherein the digital-to-analog converter is configured to scale the analog fine control signal in response to the digital fine control signal while an amplitude range of the digital fine control signal remains constant.

13. The module as claimed in claim 10, wherein the digital-to-analog converter is configured to provide the analog fine control signal as a differential signal, and the coarse amplitude controller is configured to provide differential to single ended conversion of the analog fine control signal.

14. A transmitter, comprising:
an antenna; and
a module that includes:
  an amplifier;
  a power supply modulator for modulating a power supply to the amplifier with an analog modulation signal; and
  an apparatus configured to provide the analog modulation signal, the apparatus including:
    a power controller configured to generate an indication of a desired mean output power of the power amplifier, the indication comprising a coarse control signal providing a relatively coarse indication and a fine control signal providing a relatively fine indication;
    a coarse amplitude controller configured to provide relatively coarse control of an amplitude of the modulation signal in response to the coarse control signal; and
    a fine amplitude controller configured to provide relatively fine control of the amplitude of the modulation signal in response to the fine control signal,
  wherein the modulation signal is provided as a digital modulation signal, and the apparatus comprises a digital-to-analog converter for converting the digital modulation signal to an analog modulation signal;
  wherein the digital-to-analog converter is adapted to provide the relatively fine control of the amplitude of the analog modulation signal in response to the fine control signal; and
  wherein the coarse amplitude controller comprises a variable gain amplifier coupled to an output of the digital-to-analog converter and having a gain responsive to the coarse control signal.

15. The transmitter as claimed in claim 14, further comprising:
a sigma-delta converter configured to convert a digital frequency component of the analog modulation signal to a digital control signal; and
a phase-locked loop configured to provide an input signal to the power amplifier based on the digital control signal.

16. The transmitter as claimed in claim 14, wherein the fine control signal is a digital fine control signal and the digital-to-analog converter is configured to convert the digital fine control signal to an analog fine control signal and provide the relatively fine control of the amplitude of the analog modulation signal in response to the digital fine control signal.

17. The transmitter as claimed in claim 16, wherein the digital-to-analog converter comprises:
a differential pair of outputs;
an array of selectable current elements configured to provide respective reference currents to either output of the differential pair of outputs;
a selector configured to select, dependent on the digital fine control signal, which of the current elements provide their respective reference current to the outputs; and
a current controller configured to control the selected reference current dependent on the digital fine control signal.

18. The transmitter as claimed in claim 16, wherein the digital-to-analog converter is configured to scale the analog fine control signal in response to the digital fine control signal while an amplitude range of the digital fine control signal remains constant.

19. The transmitter as claimed in claim 16, wherein the digital-to-analog converter is configured to provide the analog fine control signal as a differential signal, and the coarse amplitude controller is configured to provide differential to single ended conversion of the analog fine control signal.

20. A communication device, comprising:
a communication processor configured to provide a modulation signal; and
a transmitter that includes:
an antenna; and
a module that includes:
an amplifier;
a power supply modulator for modulating a power supply to the amplifier with an analog modulation signal; and
an apparatus configured to provide the analog modulation signal, the apparatus including:
a power controller configured to generate an indication of a desired mean output power of the power amplifier, the indication comprising a coarse control signal providing a relatively coarse indication and a fine control signal providing a relatively fine indication;
a coarse amplitude controller configured to provide relatively coarse control of an amplitude of the modulation signal in response to the coarse control signal; and
a fine amplitude controller configured to provide relatively fine control of the amplitude of the modulation signal in response to the fine control signal,
wherein the modulation signal is provided as a digital modulation signal, and the apparatus comprises a digital-to-analog converter for converting the digital modulation signal to an analog modulation signal;
wherein the digital-to-analog converter is adapted to provide the relatively fine control of the amplitude of the analog modulation signal in response to the fine control signal; and
wherein the coarse amplitude controller comprises a variable gain amplifier coupled to an output of the digital-to-analog converter and having a gain responsive to the coarse control signal.

21. The communication device as claimed in claim 20, further comprising:
a sigma-delta converter configured to convert a digital frequency component of the analog modulation signal to a digital control signal; and
a phase-locked loop configured to provide an input signal to the power amplifier based on the digital control signal.

22. The communication device as claimed in claim 20, wherein the fine control signal is a digital fine control signal and the digital-to-analog converter is configured to convert the digital fine control signal to an analog fine control signal and provide the relatively fine control of the amplitude of the analog modulation signal in response to the digital fine control signal.

23. The communication device as claimed in claim 22, wherein the digital-to-analog converter comprises:
a differential pair of outputs;
an array of selectable current elements configured to provide respective reference currents to either output of the differential pair of outputs;
a selector configured to select, dependent on the digital fine control signal, which of the current elements provide their respective reference current to the outputs; and
a current controller configured to control the selected reference current dependent on the digital fine control signal.

24. The communication device as claimed in claim 22, wherein the digital-to-analog converter is configured to scale the analog fine control signal in response to the digital fine control signal while an amplitude range of the digital fine control signal remains constant.

25. The communication device as claimed in claim 22, wherein the digital-to-analog converter is configured to provide the analog fine control signal as a differential signal, and the coarse amplitude controller is configured to provide differential to single ended conversion of the analog fine control signal.

* * * * *